(12) United States Patent
Hung

(10) Patent No.: US 7,556,087 B2
(45) Date of Patent: Jul. 7, 2009

(54) HEAT DISSIPATING MODULE

(75) Inventor: Te-Fu Hung, Keelung (TW)

(73) Assignee: Portwell Inc., Taipei (TW)

( * ) Notice: Subject to any disclaimer, the term of this patent is extended or adjusted under 35 U.S.C. 154(b) by 99 days.

(21) Appl. No.: 11/717,119

(22) Filed: Mar. 13, 2007

(65) Prior Publication Data
US 2008/0158816 A1 Jul. 3, 2008

(30) Foreign Application Priority Data
Dec. 29, 2006 (TW) ............................. 95223157 U

(51) Int. Cl.
*H05K 7/20* (2006.01)
*F28F 7/02* (2006.01)
(52) U.S. Cl. .................. 165/80.3; 165/122; 361/697
(58) Field of Classification Search ............... 165/80.2, 165/80.3, 121; 361/697
See application file for complete search history.

(56) References Cited
U.S. PATENT DOCUMENTS

| | | | | |
|---|---|---|---|---|
| 5,638,895 A * | 6/1997 | Dodson | ..................... | 165/121 |
| 5,704,419 A * | 1/1998 | Agonafer et al. | ............ | 165/121 |
| 5,927,385 A * | 7/1999 | Yeh | ............................ | 165/80.3 |
| 6,507,491 B1 * | 1/2003 | Chen | ........................... | 361/697 |
| 6,525,940 B1 * | 2/2003 | Chen et al. | .................. | 361/697 |
| 7,382,616 B2 * | 6/2008 | Stefanoski | .................. | 361/698 |
| 2007/0181287 A1 * | 8/2007 | Peng et al. | ................. | 165/80.3 |

* cited by examiner

*Primary Examiner*—Teresa J Walberg
(74) *Attorney, Agent, or Firm*—Bacon & Thomas, PLLC

(57) ABSTRACT

The present invention discloses a heat dissipating module applied to a low-level chip for dissipating the heat produced by the low-level chip. The heat dissipating module has a base, and the base accommodates a fan. The base includes first and second fin modules, and the first and second fin modules are comprised of a plurality of unidirectional fins. The first heat dissipating module is installed separately at two corresponding ends of the base, and the second fin module is disposed within the first fin module, and the fins on the second fin module are arranged in an outwardly ascending shape, and the fins at the farthest distance from the fan are bent inwardly. The invention not only allows outside air to enter into the base through the outwardly ascending fins without being blocked by the fins adjacent to the fan, but also increases the heat dissipating area.

4 Claims, 5 Drawing Sheets

HEAT DISSIPATING MODULE

BACKGROUND OF THE INVENTION

1. Field of the Invention

The present invention relates to a heat dissipating module assembly, and more particularly to a heat dissipating module having first and second fin modules comprised of a plurality of unidirectional fins disposed on a base of the heat dissipating module, and the second fin module is situated within the first fin module, and the fins of the second fin module are arranged in an outwardly ascending shape, and the fins far apart from the fan are inwardly bent, so as to increase the airflow and the heat dissipating area.

2. Description of the Related Art

In general, a conventional heat sink for a low-level chip (such as a multimedia processor, a Southbridge chip and a Northbridge chip, etc) as shown in FIG. 1 includes a heat dissipating base 100, and the heat dissipating base 100 has a seat 101, and the seat 101 has a plurality of orderly arranged and integrally formed fins 102, such that when the fan 103 is installed in the heat dissipating base 100, the fins at the periphery of the fan 103 are of the same height and in the same level, and each fin is extended outward in a radial form. Therefore, the radiating angle will be the same as the direction of the airflow, and the airflow produced by the fan cannot flow among the fins successfully, and outside air is also blocked by the fins and cannot get close to the fan. Furthermore, the heat dissipating base 100 is shaped by a die casting method, and the development of molds incurs a high cost, and thus the cost is high and the heat dissipating effect is low for the applications of these conventional heat sinks.

In view of the shortcomings of the prior art, the inventor of the present invention based on years of experience in the related industry to conduct extensive researches and experiments, and finally developed a heat dissipating module in accordance with the present invention.

SUMMARY OF THE INVENTION

Therefore, it is a primary objective of the present invention to provide a heat dissipating module applied to a low-level chip for dissipating the heat produced by the low-level chip. The heat dissipating module has a base, and the base has a recession for accommodating a fan, and the base includes first and second fin modules, and the first and second fin modules are comprised of a plurality of unidirectional fins. The first heat dissipating module is installed separately at two corresponding ends of the base, and the second fin module is disposed within the first fin module, and the fins on the second fin module are arranged in an outwardly ascending shape, and the fins at the farthest distance from the fan are bent inwardly. The invention not only allows outside air to enter into the base through the outwardly ascending fins without being blocked, but also increases a heat dissipating area.

Another objective of the present invention is to provide a heat dissipating module, wherein the fins disposed on the second fin module and at the farthest distance from the fan are bent inwardly, such that when the heat dissipating module is in use, the airflow is blocked by the rotating fan and bounced back to the inner layer of fins, so as to increase the airflow and the heat dissipating area.

A further objective of the present invention is to provide a heat dissipating module, wherein the height of the fan is not greater than the height of the fin disposed at the farthest end of the second fin module, and thus the invention can increase the airflow and the heat dissipating area while maintaining a small size and volume of the heat dissipating module.

DETAILED DESCRIPTION OF THE PREFERRED EMBODIMENTS

To make it easier for our examiner to understand the technical characteristics of the invention, we use preferred embodiments together with the attached drawings for the detailed description of the invention.

Figure 1:
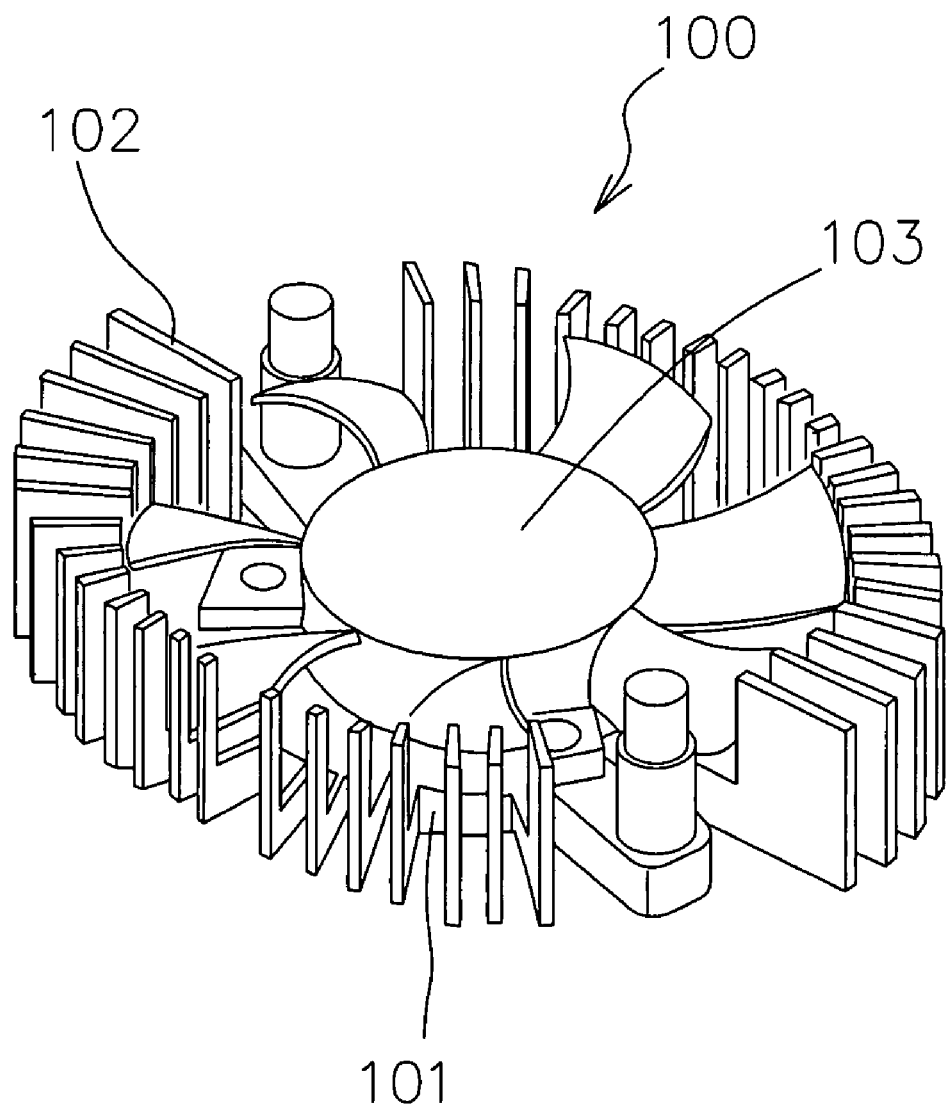
FIG. 1 is a schematic view of a prior art apparatus.
Figure 2:
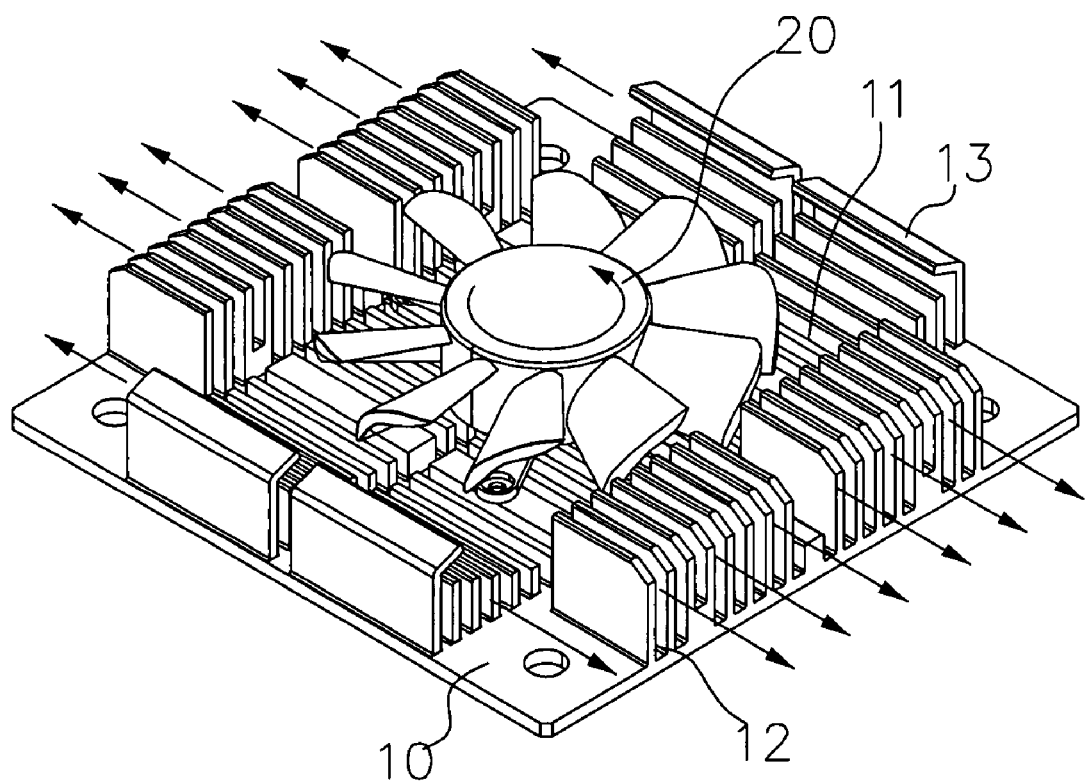
FIG. 2 is a perspective view of the present invention.
Figure 3:
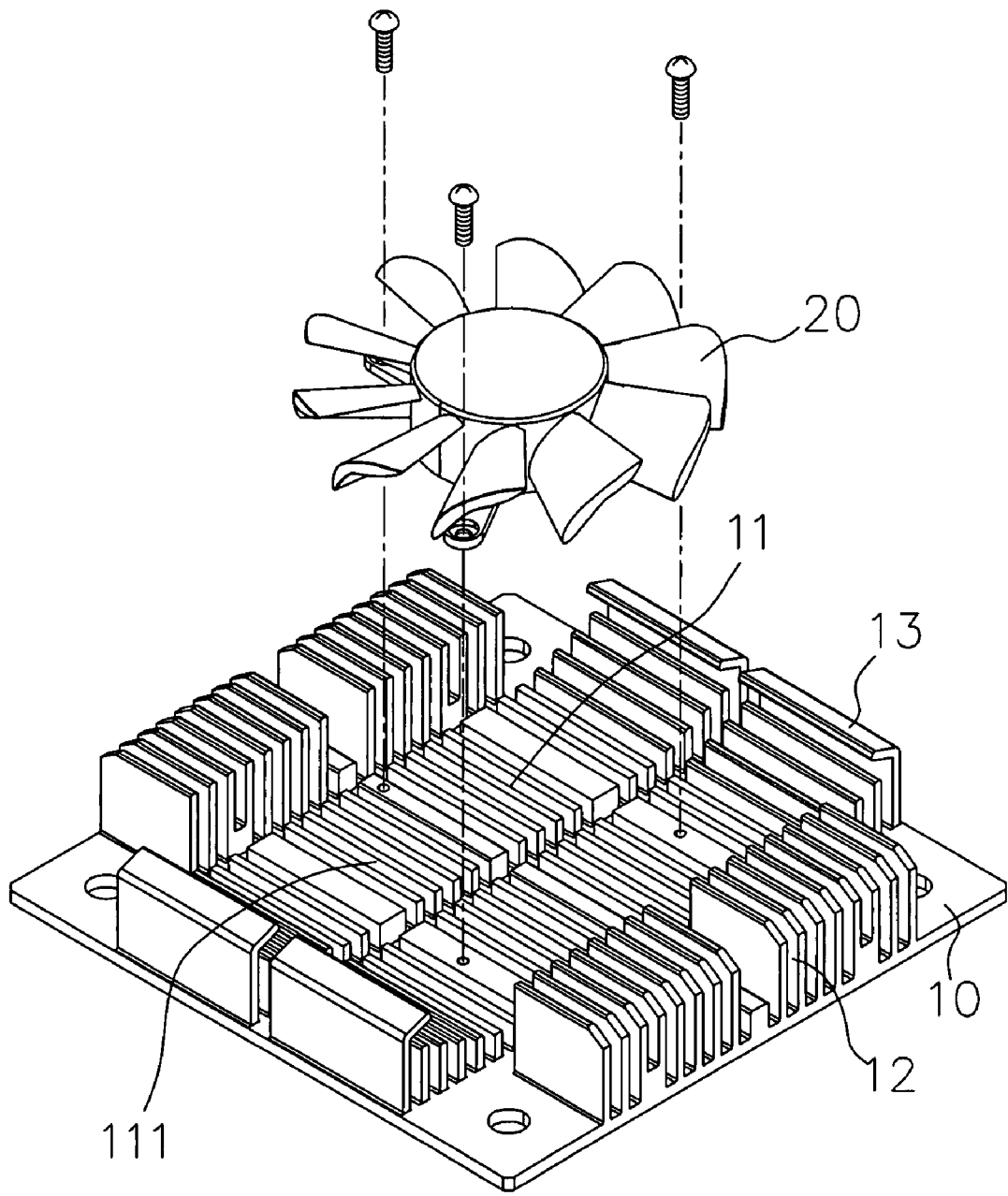
FIG. 3 is an exploded view of the present invention.
Figure 4:
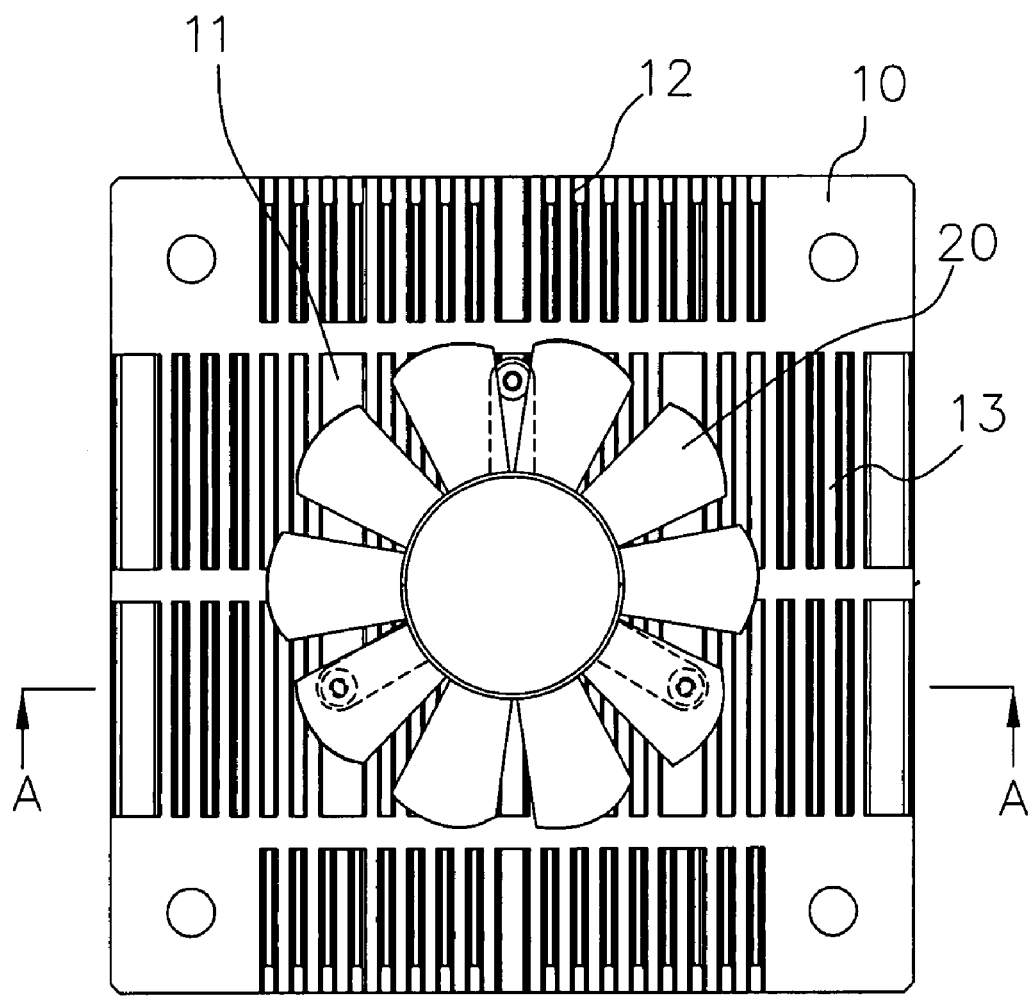
FIG. 4 is a top view of the present invention.

Referring to FIGS. 2 to 4 for a heat dissipating module in accordance with the present invention, the heat dissipating module is applied to a low-level chip (such as a multimedia processor, a Southbridge chip and a Northbridge chip, etc) for dissipating the heat produced by the low-level chip, and the heat dissipating module has a base 10 made by an aluminum extrusion process, and the base 10 in this embodiment is a rectangular base. The base 10 has a recession 11, and the surface of the recession 11 has a plurality of protrusions for increasing the heat dissipating area, and the recession 11 is provided for precisely containing a fan 20, and two corresponding edges of the base 10 separately have a first fin module 12, and the first fin module 12 is comprised of orderly arranged fins with the same height. Further, a second fin module 13 is disposed within the first heat dissipating module. The fins of the second fin module 13 are arranged in an outwardly ascending shape, and the fins of the first and second fin modules 12, 13 are arranged in the same direction, so that the invention not only allows outside air to flow into the base 10 through the outwardly ascending fins of second fin module 13 without being blocked, but also increases the heat dissipating area (as shown in FIG. 5).

Figure 5:
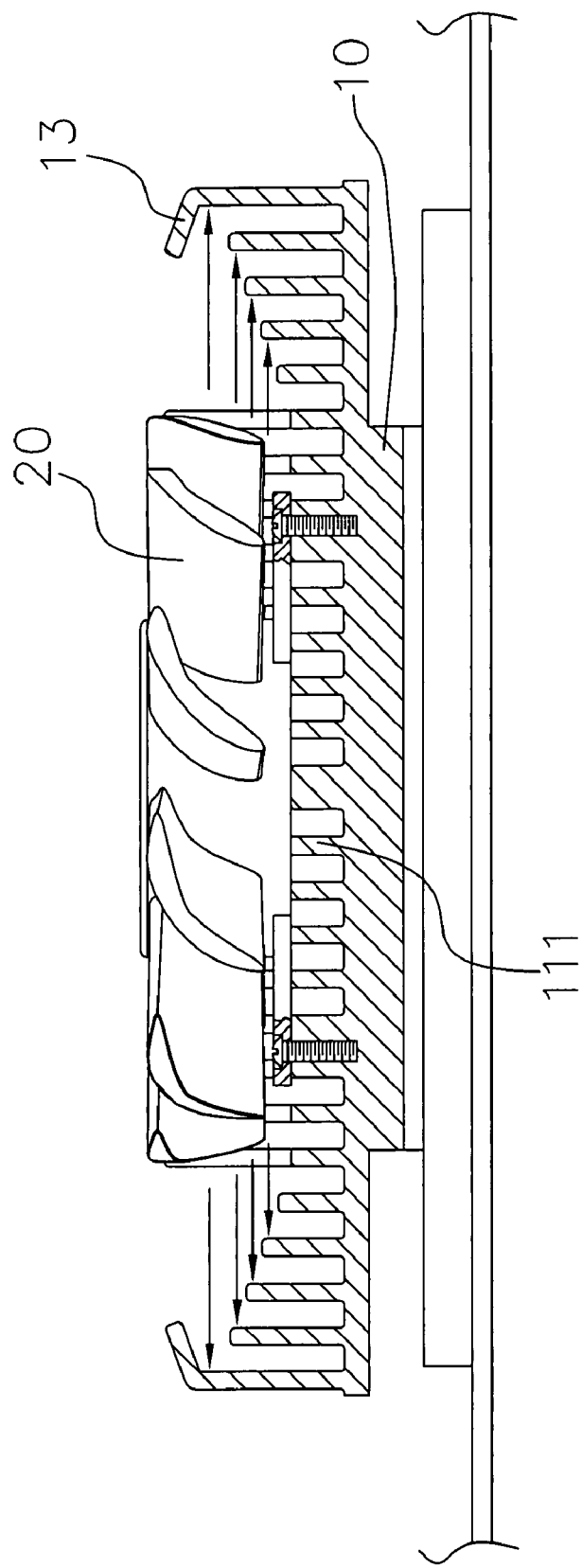
FIG. 5 is a cross-sectional view of movements at Section A-A in accordance with the present invention.

Further, the fins disposed on the second fin module 13 and at the farthest distance from the fan 20 are bent inwardly, such that when the heat dissipating module is in use, the airflow produced by the rotation of the fan is blocked and bounced back to an inner layer of fins by the inwardly bent fins, so as to increase the airflow and the heat dissipating area (as shown in FIG. 5).

Since the height of the fan 20 is not greater than the fin at the farthest end of the second fin module 13, therefore the airflow produced by the rotating fan 20 will not be overflowed from the top of the fin, and the airflow are used completely for dissipating the heat. As a result, the airflow can be increased without increasing the size of the fan 20, and the cost can be lowered In summation of the above description, the overall assembly and characteristics of the present invention herein enhance the performance than the conventional structure and further complies with the patent application requirements and is duly filed for a patent application.

While the invention has been described by means of specific embodiments, numerous modifications and variations could be made thereto by those skilled in the art without departing from the scope and spirit of the invention set forth in the claims.

What is claimed is:

1. A heat dissipating module, applied to a low-level chip for dissipating heat, comprising:
 a base, wherein said base has a recess for containing a fan, and a surface of said recess has a protrusion for increasing a heat dissipating area;
 a first fin module, comprised of a plurality of unidirectional fins; and
 a second fin module, comprised of a plurality of unidirectional fins:
 such that said first fin module is disposed separately on two corresponding ends of said base, and said second fin module is disposed within said corresponding first fin module, and said fins of said second fin module are arranged in an outwardly ascending shape, and said outwardly ascending fins allow outside air to flow into said base without being blocked, so as to increase a heat dissipating area, and said fins disposed on said second fin module and at the farthest distance from said fan are bent inward, such that when said heat dissipating module is in use, the airflow produced by said rotating fan is blocked and bounced back to an inner layer of fins by said inwardly bent fins.

2. The heat dissipating module of claim 1, wherein said first fin module is comprised of a plurality of spaced apart fins having the same height with each other.

3. The heat dissipating module of claim 1, wherein said heat dissipating module is integrally formed by an aluminum extrusion method.

4. The heat dissipating module of claim 1, wherein said fan has a height smaller than the height of a fin disposed on said second fin module and at the farthest position from said fan.

* * * * *